(12) United States Patent
Bennett et al.

(10) Patent No.: US 10,240,254 B2
(45) Date of Patent: Mar. 26, 2019

(54) METHOD OF FABRICATING PLATES OF SUPER-HARD MATERIAL USING A COLLIMATED CUTTING BEAM

(71) Applicant: ELEMENT SIX TECHNOLOGIES LIMITED, Didcot, Oxfordshire (GB)

(72) Inventors: Andrew Michael Bennett, Didcot (GB); Laura Anne Hutton, Didcot (GB); Geoffrey Alan Scarsbrook, Didcot (GB)

(73) Assignee: Element Six Technologies Limited, Didcot, Oxfordshire (GB)

( * ) Notice: Subject to any disclaimer, the term of this patent is extended or adjusted under 35 U.S.C. 154(b) by 65 days.

(21) Appl. No.: 15/507,539

(22) PCT Filed: Nov. 2, 2015

(86) PCT No.: PCT/EP2015/075470
§ 371 (c)(1),
(2) Date: Feb. 28, 2017

(87) PCT Pub. No.: WO2016/071282
PCT Pub. Date: May 12, 2016

(65) Prior Publication Data
US 2017/0306524 A1    Oct. 26, 2017

(30) Foreign Application Priority Data

Nov. 7, 2014   (GB) .................................. 1419809.7

(51) Int. Cl.
| C30B 25/20 | (2006.01) |
| B23K 15/00 | (2006.01) |
| B23K 15/08 | (2006.01) |
| C23C 16/27 | (2006.01) |
| C30B 29/04 | (2006.01) |
| C30B 33/06 | (2006.01) |
| B28D 1/22 | (2006.01) |
| B23K 26/146 | (2014.01) |

(Continued)

(52) U.S. Cl.
CPC .......... *C30B 25/20* (2013.01); *B23K 15/0006* (2013.01); *B23K 15/08* (2013.01);
(Continued)

(58) Field of Classification Search
None
See application file for complete search history.

(56) References Cited

U.S. PATENT DOCUMENTS

| 6,562,127 B1 | 5/2003 | Kud et al. |
| 7,163,875 B2 | 1/2007 | Richerzhagen |

(Continued)

FOREIGN PATENT DOCUMENTS

| EP | 0762947 B1 | 3/2003 |
| EP | 2189236 A1 | 5/2010 |

(Continued)

OTHER PUBLICATIONS

United Kingdom Patent Application No. GB1519336.0, Combined Search and Examination Report dated Nov. 12, 2015, 4 pages.

(Continued)

*Primary Examiner* — Jacob T Minskey
(74) *Attorney, Agent, or Firm* — Dean W. Russell; Clark F. Weight; Kilpatrick Townsend & Stockton LLP

(57) ABSTRACT

A method of fabricating plates of super-hard material and cutting techniques suitable for such a method. A method of fabricating a plate (14) of super-hard material, the method comprising: •providing a substrate (4) have a lateral dimension of at least 40 mm; •growing a layer of super-hard material on the substrate (4) using a chemical vapor deposition process; and •slicing one or more plates (14) of
(Continued)

super-hard material from the substrate using a collimated cutting beam (8), the or each plate of super-hard material (14) having a lateral dimension of at least 40 mm, wherein the collimated cutting beam (8) is collimated with a half angle divergence of no more than 5 degrees.

12 Claims, 2 Drawing Sheets

(51) Int. Cl.
*B23K 26/38* (2014.01)
*B23K 26/402* (2014.01)
*C30B 33/02* (2006.01)
*C30B 33/04* (2006.01)
*B23K 103/00* (2006.01)

(52) U.S. Cl.
CPC ............ *B23K 26/146* (2015.10); *B23K 26/38* (2013.01); *B23K 26/402* (2013.01); *B28D 1/221* (2013.01); *C23C 16/27* (2013.01); *C30B 29/04* (2013.01); *C30B 33/02* (2013.01); *C30B 33/04* (2013.01); *C30B 33/06* (2013.01); *B23K 2103/50* (2018.08)

(56) References Cited

U.S. PATENT DOCUMENTS

| | | |
|---|---|---|
| 7,728,258 B2 | 6/2010 | Richerzhagen et al. |
| 2007/0034147 A1 | 2/2007 | Wort et al. |
| 2014/0209579 A1 | 7/2014 | Chen et al. |

FOREIGN PATENT DOCUMENTS

| | | |
|---|---|---|
| EP | 1833636 B1 | 7/2010 |
| EP | 2208568 A1 | 7/2010 |
| GB | 2488498 A | 8/2012 |
| GB | 2506740 A | 4/2014 |
| JP | 2005144484 A | 6/2005 |
| JP | 2007500439 A | 1/2007 |
| JP | 2009266892 A | 11/2009 |
| WO | 9956907 A1 | 11/1999 |
| WO | 2005010245 A1 | 2/2005 |
| WO | 2014029671 A1 | 2/2014 |

OTHER PUBLICATIONS

International Patent Application No. PCT/EP2015/075470, International Search Report and Written Opinion dated Apr. 15, 2016, 17 pages.
United Kingdom Patent Application No. GB1519336.0, Notification of Grant dated Feb. 7, 2017, 2 pages.

METHOD OF FABRICATING PLATES OF SUPER-HARD MATERIAL USING A COLLIMATED CUTTING BEAM

CROSS REFERENCE TO RELATED APPLICATIONS

This application is the U.S. national phase of International Application No. PCT/EP2015/075470 filed on Nov. 2, 2015, and published in English on May 12, 2016 as International Publication No. WO 2016/071282 A1, which application claims priority to United Kingdom Patent Application No. 1419809.7 filed on Nov. 7, 2014, the contents of all of which are incorporated herein by reference.

FIELD OF INVENTION

The present invention relates to a method of fabricating plates of super-hard material and cutting techniques suitable for use in such a method.

BACKGROUND OF INVENTION

In the context of the present invention super-hard materials are defined as those materials having a Vickers hardness of no less than 2000 kg/mm$^2$. These materials include a range of diamond materials, cubic boron nitride materials (cBN), sapphire, and composites comprising the aforementioned materials. For example, diamond materials include chemical vapour deposited (CVD) single crystal and polycrystalline synthetic diamond materials of a variety of grades, high pressure high temperature (HPHT) synthetic diamond materials of a variety of grades, natural diamond material, and diamond composite materials such as polycrystalline diamond which includes a metal binder phase (PCD) or silicon cemented diamond (ScD) which includes a silicon/silicon carbide binder phase.

In relation to the above, it should be noted that while super-hard materials are exceeding hard, they are generally very brittle and have low toughness. As such, these materials are notoriously difficult to cut. Any cutting method must be sufficiently aggressive to overcome the extreme hardness of the material to form a cut while at the same time must not impart a large degree of stress or thermal shock to the material which would cause macroscopic fracturing of the material due to its brittle nature and low toughness. As such, there is narrow operating window for achieving successful cutting of super-hard materials and many available cutting methods fall outside this operating window. For example, most cutting methods are not sufficiently aggressive to cut super-hard materials to any significant extent in reasonable time-frames. Conversely, more aggressive cutting techniques tend to impart too much stress and/or thermal shock to the super-hard material thus causing cracking and material failure. Furthermore, certain cutting methods have operational parameters which can be altered so as to move from a regime in which no significant cutting of a super-hard material is achieved into a regime in which cutting is achieved but with associated cracking and failure of the super-hard material. In this case, there may or may not be a transitional window of parameter space in which cutting can be achieved without cracking and failure of the super-hard material. The ability to operate within a suitable window of parameter space in which cutting can be achieved without cracking and failure of the super-hard material will depending on the cutting technique, the size of any transitional operating window for such a technique, and the level of operation parameter control which is possible to maintain cutting within the window of parameter space in which cutting can be achieved without cracking and failure of the super-hard material.

In light of the above, it will be appreciated that cutting of super-hard materials is not a simple process and although a significant body of research has been aimed at addressing this problem current cutting methods are still relatively time consuming and expensive, with cutting costs accounting for a significant proportion of the production costs of super-hard material products.

Super-hard materials are currently cut with one or more of:

(i) wire EDM (Electrical Discharge Machining) machines for electrically conducting materials such as doped CVD synthetic diamond, HPHT synthetic diamond, and cBN products;

(ii) high power lasers for electrically insulating materials such as un-doped CVD synthetic diamond, HPHT synthetic diamond and cBN products; or (iii) cutting saws typically impregnated with other super-hard materials such as diamond.

EDM cutting is efficient for electrically conductive materials, however cannot be used on any insulating materials. Traditional saws can be used for providing small cuts, but become time and cost inefficient when used for bulk processing, as well as struggling to provide good cuts at high depths. To obtain efficient cutting with lasers, the beams need to be focused to a small, very intense spot. Whilst a focused beam is very suitable for relatively thin products, the kerf losses, due to the fact the beam is divergent, having been focused down from a relatively large starting beam, result in a high amount of material wastage and increased laser cutting time. This is particularly problematic when cutting vertically through thick layers of super-hard material or cutting laterally through a large area layer of super-hard material such as when large wafers of CVD synthetic diamond or slugs of cBN need to be sliced into relatively thin wafers.

The need for methods which are capable of processing larger pieces of super-hard material has increased in recent years as synthesis technologies have been developing to allow fabrication of larger pieces of super-hard material. For example, in recent years techniques have been developed for growing layers of single crystal CVD diamond over larger areas using chemical vapour deposition techniques. In such a technique, a plurality of smaller single crystal substrates may be tiled together into an array and then a coherent single layer of single crystal CVD diamond material can be grown over the tiled array of substrates. One problem with such a fabrication technique is that it is difficult to then remove the large area layer of single crystal CVD diamond material from the tiled array of substrates on which it is grown. While the previously described cutting techniques, such as a focused high power laser, can be used to slice a small crystal of diamond material from its associated growth substrate, such a technique is not suitable for removal of a large area layer of single crystal material from a tiled array of substrates as the process requires a very deep cut to horizontally slice the large area layer of material from its associated growth substrate. Accordingly, to date such large area layers of super-hard material have been removed from the substrate on which they are grown using a chemical etch and lift-off technique. Such a technique is described in GB2488498 and comprises: implanting ions into a plurality of single-crystal diamond substrates to form non-diamond layers in the vicinity of the surfaces of the single-crystal diamond substrates; arranging the single-crystal diamond substrates to form a mosaic pattern on a flat support; growing a single-crystal CVD diamond layer on the ion-implanted surfaces of the single-crystal diamond substrates; and etching the non-diamond layers to separate the single-crystal CVD diamond layer from the plurality of single-crystal diamond substrates.

Such implantation, growth, chemical etching, and lift-off techniques have several associated problems. For example, the implantation technique can damage the growth surface of the substrates such that the CVD material grown thereon is of poorer quality. Furthermore, the etching step can be difficult to control and can be time consuming and expensive.

It is an aim of embodiments of the present invention to solve one or more of the aforementioned problems.

SUMMARY OF INVENTION

According to a first aspect of the present invention there is provided a method of fabricating a plate of super-hard material, the method comprising:
providing a substrate have a lateral dimension of at least 40 mm;
growing a layer of super-hard material on the substrate using a chemical vapour deposition process; and
slicing one or more plates of super-hard material from the substrate using a collimated cutting beam, the or each plate of super-hard material having a lateral dimension of at least 40 mm, wherein the collimated cutting beam is collimated with a half angle divergence of no more than 5 degrees.

Examples of collimated cutting beams suitable for use in this method include water jet lasers and collimated electron beams. The methodology is particularly suited to slicing thin plates from a large area wafer of super-hard material. Unlike conventional focussed lasers and cutting saws, such collimated cutting beams are capable of deep cutting though super-hard materials at relatively high rates and with low kerf loss to remove thin, large area plates of material from an as-grown wafer of material (optionally edge trimmed) oriented edge-on to the collimated cutting beam.

It has been found that the cutting parameters of an electron beam can be tailored for efficient cutting without undue thermal loading leading to cracking of the super-hard material. Furthermore, recent water-jet laser cutting technology is ideally suited for this type of cutting application due to the collimated nature of the cutting beam and the fact that in addition to providing wave-guiding of the laser to achieve a thin collimated cutting beam, the water jet also aids in cooling the super-hard material and removing debris from the cutting location. One of the key challenges with deep cuts using water jet systems is a build-up of excess water in the cut itself. Since the water provides wave-guiding of the laser, pooling of water at the base of the cut leads to a loss of beam collimation and a loss in cutting action. As such, when using this technique the water jet laser and the layer of super-hard material can be configured such that during slicing water is actively ejected from a cut formed in the super-hard material thereby reducing pooling of water at a base of the cut. For example, water can be ejected from the cut formed in the super-hard material thereby reducing pooling of water at the base of the cut by rotating the layer of super-hard material relative to the collimated cutting beam to force water from the cut. The rotation may be performed continuously during the cutting process or the sample of super-hard material may be periodically rotated to remove water during the cutting procedure. Alternative techniques to the use of rotation to force water from the base of the cut may be utilized. By using such techniques during cutting the water and debris is forced outwards from the cut to improve cutting performance and quality of cut. Furthermore, if the super-hard material sample is rotated during cutting, the actual cut depth required to slice off a 40 mm diameter plate will only be 20 mm with the 20 mm cut from different directions meeting in the centre of the sample to completely remove the 40 mm plate. Further still, it will be understood that when using a collimated cutting beam as described herein to remove a 40 mm plate from its associated substrate, the entire slicing and removal process need not be performed by the collimated cutting beam. For example, a plate may be partially sliced from its associated substrate using a collimated cutting beam as described herein and then the remainder of the material connecting the partially sliced plate to its associated substrate may be removed using another cutting technique.

In addition, or as an alternative, the cut may be made broader to aid water flow away from the base of the cut and alleviate the problems of pooling of water at the base of the cut. This may be done by using a suitable step-cutting or so-called benching routine in which the cutting beam is moved laterally relative to the cut such that an entry point of the cut is made wider relative to a base of the cut. Furthermore, it may be noted that if the layer of super-hard material is rotated relative to the collimated cutting beam to force water from the cut then the layer of super-hard material does not necessarily need to rotate around its own central axis of rotation.

The water-jet laser cutting methodology as described above can also be applied to other materials where a relatively deep cut is required and when water pooling at the base of a cut becomes problematic. Therefore, according to another aspect of the present invention there is provided a method and associated cutting apparatus for cutting a material using a water jet laser, the method comprising:
cutting the material using the water-jet laser; and
forcing water from a base of a cut formed in the material thereby reducing pooling of water at the base of the cut during the cutting procedure.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION OF CERTAIN EMBODIMENTS

Figure 1:
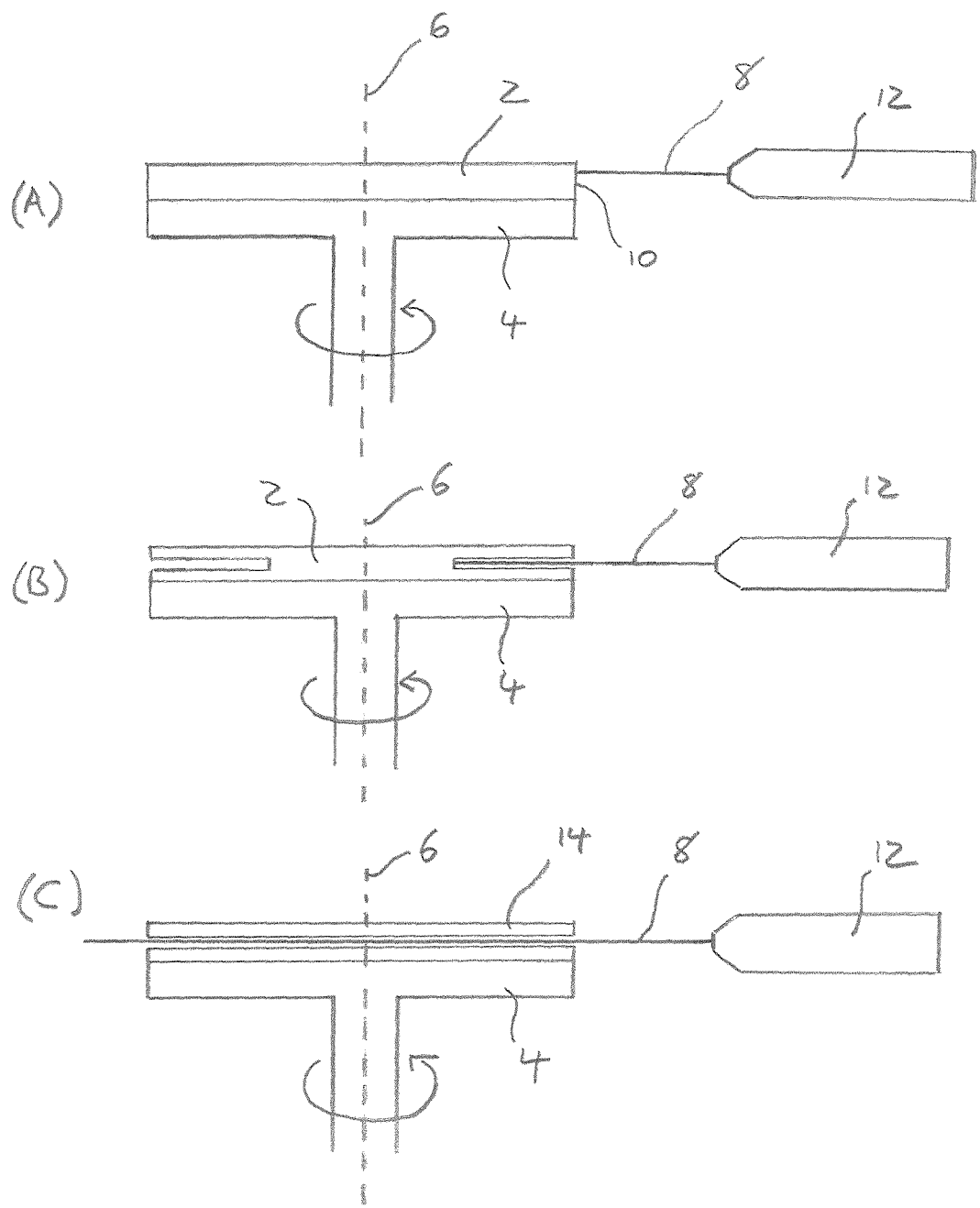
FIGS. 1A to 1C illustrate the basic cutting configuration and methodology according to embodiments of the invention.

Ideally, any method for cutting super-hard materials would provide a combination of the following features:
(i) a low kerf loss, e.g. using a highly collimated cutting beam;
(ii) a high cutting rate and reduced cutting time;

(iii) a high degree of flexibility such that the cutting technology can be applied to a range of super-hard materials;
(iv) a high degree of controllability to achieve precise control of cutting location, cutting velocity, cutting depth, and cutting width; and
(v) a low degree of material damage to achieve cutting of a super-hard material without causing damage such as cracking of the material.

The aforementioned advantageous technical features must also be balanced against the economic viability of any cutting technique which is to be used in a commercial process. Economic viability will be dependent on:
(i) initial hardware costs; and
(ii) operating costs including:
  a. the cost of consumables such as power and gas supplies;
  b. the cost of maintenance and the lifetime of the cutting apparatus which will be dependent to some extent on the complexity and reliability of the cutting apparatus;
  c. operational cutting time versus down-time which will be dependent on the time required to set up the cutting apparatus between cutting operations; and
  d. personnel costs, e.g. if skilled operators are required to run the apparatus which again will depend to some extent on the complexity and reliability of the cutting apparatus.

Given the above requirements for a commercial cutting process for super-hard materials, EDM cutting has become the industry standard for electrically conductive super-hard materials whereas high powered lasers have become the industry standard for cutting electrically insulating super-hard materials. While high powered lasers could also be used for cutting electrically conductive super-hard materials EDM cutting is often preferred due to reduced capital and running costs when compared to laser cutting.

The present inventors have re-visited the problem of cutting super-hard materials to assess whether any alternatives exist which may provide improved performance compared to the well accepted industry standards. For example, as previously described, high powered lasers suffer problems of kerf loss and relatively slow cutting speeds, particularly when cutting thick super-hard materials due to the application of a divergent beam. In contrast, electron beams can be made highly collimated with a very small spot size (i.e. a high brightness beam) and thus provide the potential for cutting with reduced kerf losses and potentially at higher cutting rates. In this regard a new electron beam cutting technique for super-hard materials has been developed which provides a cutting time improvement of over an order of magnitude (even up to two or three orders of magnitude for certain super-hard materials) when compared with previous electron beam cutting techniques and current high powered lasers. The new electron beam cutting technique is described in WO2014/029671. The technique uses an electron beam which is moved across the surface of a super-hard material at high velocity. Typically an electron beam scanning velocity of below 100 mm/s will result in cracking and crystal breakage due to excessive thermal stress at the cutting location and/or excessive localised fracturing extending beyond the cutting location. In contrast, electron beam velocities above 5000 mm/s typically do not provide sufficient thermal stress and/or local fracturing at the cutting location to achieve any significant depth of cut. WO2014/029671 describes that relative movement of the electron beam and the super-hard material can be achieved by providing an apparatus configuration in which the electron beam is steerable. Using such a configuration, cutting is achieved by controlling and steering the electron beam rather than moving the super-hard material to be cut relative to a fixed electron beam.

Another recently developed, highly collimated cutting technique is the water-jet laser cutting technique in which a fine jet of water is used as a waveguide for a laser beam projected along the water jet. Such cutting technology is described, for example, in a number Synova patent publications including EP2189236B1, EP1833636B1, EP2208568A1, U.S. Pat. No. 7,728,258B2, U.S. Pat. No. 7,163,875B2, EP762947B1, and WO1999056907A1. It is also pertinent to note that Synova are also selling such laser systems for use in cutting diamond materials. For diamond cutting applications, Synova brochures indicate that a working distance of up to 30 mm is possible.

Certain embodiments of the present invention involve the adaptation of highly collimated cutting techniques such as the above-described electron beam and water jet laser technologies for efficient slicing of large area wafers of super-hard material. Particular methods as described herein are directed to the slicing of large area wafers of single crystal CVD diamond material to remove such wafers from their growth substrate. Highly collimated cutting techniques as described herein can also be adapted for efficient slicing of extremely thin plates of super-hard material.

As described in the summary of invention section, according one aspect of the present invention there is provided a method of fabricating a plate of super-hard material, the method comprising:
  providing a substrate have a lateral dimension of at least 40 mm;
  growing a layer of super-hard material on the substrate using a chemical vapour deposition process; and
  slicing one or more plates of super-hard material from the substrate using a collimated cutting beam, the or each plate of super-hard material having a lateral dimension of at least 40 mm, wherein the collimated cutting beam is collimated with a half angle divergence of no more than 5 degrees.

The super-hard material may be formed of synthetic CVD diamond such as polycrystalline or single crystal CVD diamond material. For example, as previously described, single crystal CVD diamond can be grown on a tiled array of single crystal diamond substrates, and one or more plates of single crystal CVD diamond can then be sliced from the tiled array of single crystal diamond substrates using a collimated cutting beam technique as described herein. Advantageously, the layer of super-hard material may be grown to a thickness of at least 100 μm, 200 μm, 300 μm, 500 μm, 1 mm, 3 mm, or 5 mm. By growing a thick layer of super-hard material a plurality of plates can then be sliced from the layer of super-hard material. The plates of super-hard material which are sliced from the layer of super-hard material may have a thickness of no more than 100 μm, 80 μm, 60 μm, or 50 μm when very thin plates of super-hard material are desired. The or each plate of super-hard material may have a lateral dimension of at least 50 mm, 60 mm, 80 mm, 100 mm, 120 mm, or 140 mm. The collimated cutting beam is advantageously collimated with a half angle divergence of no more than 3 degrees, 1 degree, or 0.5 degrees for such applications. Furthermore, the collimated slicing technique may comprise cutting through the layer of super-hard material in at least two different directions to remove the or each plate of super-hard material from the substrate. For example, the super-hard material may be partially sliced from one side and then partially sliced from an opposite side to achieve removal of a plate. Alternatively, the super-hard material may be rotated during the slicing procedure to achieve removal of a plate.

As previously described, the collimated cutting beam may be in the form of an electron beam or a water jet laser. When a water jet laser is used, the layer of super-hard material being sliced and the water-jet laser are configured such that during slicing water is ejected from a cut formed in the super-hard material thereby reducing pooling of water at a base of the cut. As previously described, this may be achieved by, for example, rotating the layer of super-hard material relative to the collimated cutting beam to force water from the cut during the cutting process.

In addition, or as an alternative, the cut may be made broader to aid water flow away from the base of the cut and alleviate the problems of pooling of water at the base of the cut. This may be done by using a suitable step-cutting or so-called benching routine in which the cutting beam is moved laterally relative to the cut such that an entry point of the cut is made wider. Intuitively, use of a collimated cutting beam would negate the requirement for a benching routine which is generally utilized with focused beam cutting techniques. However, in this instance use of a benching routine with a collimated water-jet can be advantageous to aid water removal and the breadth of the cut can be made sufficiently large to fulfil this criterion while not being so large that excessive super-hard material loss occurs. That is, a balance can be struck between allowing efficient water removal from the cut while not providing such a large cut that excessive amounts of super-hard material are lost during the cutting procedure. In this regard, it should be noted that while conventional benching routines form a V-shaped cutting profile due to the V-shaped cutting profile of a focussed beam, this is not required when using a collimated cutting beam as described herein. For example, the profile of the cut may be stepped, V-shaped with sloping walls, or can be parallel walled with the cutting beam being translated in a lateral direction to widen out the cut. It will be appreciated that using such a technique allows the cut to be wider than the water-jet. This can be useful to aid laminar flow of the water jet as it enters the cut and also allow water flow from the base of the cut and alleviate problems of water pooling.

Furthermore, it may be noted that if the layer of super-hard material is rotated relative to the collimated cutting beam to force water from the cut then the layer of super-hard material does not necessarily need to rotate around its own central axis of rotation. For example, a plurality of super-hard material samples may be mounted on a rotatable stage and the rotatable stage is rotated during cutting. In this way, a plurality of super-hard material samples can be cut during the same cutting procedure while forcing water from the base of the cut in each super-hard material sample by rotating around a common rotational axis.

The water-jet laser cutting methodology as described above can also be applied to other materials where a relatively deep cut is required and when water pooling at the base of a cut becomes problematic. Therefore, according to another aspect of the present invention there is provided a method and associated cutting apparatus for cutting a material using a water jet laser, the method comprising:
 (i) cutting the material using the water-jet laser; and
 (ii) forcing water from a base of a cut formed in the material thereby reducing pooling of water at the base of the cut during the cutting procedure.

The cutting methodology enables deeper, better quality cutting to be performed by alleviating problems of water pooling and loss of water jet integrity and waveguiding of the laser. The methodology can be applied for achieving cutting depths of at least 20 mm, 40 mm, 60 mm, 80 mm, 100 mm, 120 mm, or 140 mm. While such a cutting methodology can be applied to any material, it has been found to be particularly useful for super-hard materials which are otherwise difficult to process. Examples of such materials include one or more of: a diamond material; a cubic boron nitride material; sapphire; or a composite material comprising one or more of the aforementioned super-hard materials and a binder.

FIGS. 1A to 1C illustrate a basic cutting configuration and methodology. A wafer of super-hard material 2 is mounted on a support 4 which is rotatable around a rotational axis 6. The wafer of super-hard material 2 is located on the support 4 relative to a fixed collimated cutting beam 8 with the fixed collimated cutting beam 8 being oriented perpendicular to the rotational axis 6 and positioned such that the fixed collimated cutting beam 8 is directed at an outer edge 10 of the wafer of super-hard material 2 when mounted on the support 4. The collimated cutting beam 8 is generated by a suitably adapted cutting apparatus 12. The wafer of super-hard material 2 is rotated by the support 4 and the outer edge 10 of the wafer of super-hard material 2 is cut with the fixed collimated cutting beam 8 while rotating the wafer of super-hard material 2. Cutting is maintained as illustrated in FIGS. 1(B) and 1(C) until a plate 14 of super-hard material is sliced from the wafer of super-hard material 2.

In contrast to the fixed sample, single side cutting technique described in the laser water jet prior art, the aforementioned arrangement proposes the provision of a rotating diamond sample to slice off large discs of diamond material. This is contrary to what is taught in the published art for this type of cutting technology but is believed to be advantageous for slicing large area plates of diamond material. The technique is also distinct from more conventional double sided laser cutting in which a cut is made from one side of a fixed sample and then a cut is made from an opposite side of the fixed sample, i.e. the sample is not rotated during cutting.

One way to separate a large area, single crystal diamond plate from a substrate on which it is grown, such as a tiled substrate array, is via the use of a water jet laser directed side-on to the plate while simultaneously rotating the plate. The proposed technique is considered particularly useful for larger area plates where a deep cut is required to completely remove a large area plate from an underlying substrate, and may possibly be considered a replacement not just for other cutting techniques, but also for lapping processes. The water jet laser technology is capable of deep cutting with low kerf loss as it provides a collimated cutting beam.

While the cutting could be performed form one side only, or double sided cutting in which a first side is cut and then a second side is cut via a 180° flip of the sample, there are advantages to continuous rotation. For example, rotation aids in extracting debris and water from the trench, cutting is continuous without any off-sample time required to move back and forward, and the cutting routine for cutting large round wafers is simplified.

Other collimated cutting technologies can be utilized, e.g. e-beam cutting. However, one advantage of the water jet laser method is that the water cools the diamond during cutting to alleviate microcracking while also aiding to remove debris from the trench during cutting.

As previously described, the cutting methodology as described herein may ideally be used for slicing of single crystal diamond plates from a tiled array of single crystal substrates. However, the technique can also be applied to large area polycrystalline plates as well as large area single crystal plates. For example, where thin plates of electronic grade polycrystalline diamond material are required this slicing technique can be utilized.

The technique is ideally for side-on slicing of round wafers but can also be applied to polygonal wafers, of side number n=3, 4, 5, 6, 7, 8, or more. Indeed, there can be a play-off here between the ideal shape for slicing (circular) and a suitable shape for growth, e.g. square, hexagonal, or octagonal may be more appropriate for fabrication of cubic single crystal diamond material.

The wafer of super-hard material may be continuously rotated during cutting. Furthermore, the wafer of super-hard material may have a longest linear dimension of at least 40 mm, 50 mm, 60 mm, 80 mm, 100 mm, 120 mm, or 140 mm. If the wafer of super-hard material is in the form of a circular disc then this will equate to the diameter of the circular disc of super-hard material.

The fixed collimated cutting beam may be in the form of a water jet laser, an electron beam, or any other suitable cutting technology which is capable of cutting super-hard material to suitable depths, with low kerf loss, low crystal damage, and acceptable cutting rates. The fixed collimated cutting beam may be collimated with a half angle divergence of no more than 3 degrees, 1 degree, or 0.5 degrees. A more collimated beam is useful for deep cutting and/or for cutting thin plates of super-hard material. If required the fixed collimated cutting beam can be pulsed. In some applications pulsing of the cutting beam can be used to control thermal loading of the super-hard material and a balance can be struck between cutting rate and material damage.

The wafer of super-hard material may comprise one or more of: a diamond material; a cubic boron nitride material; sapphire; or a composite material comprising one or more of the aforementioned super-hard materials and a binder. For example, the wafer of super-hard material may comprise at least 50%, 60%, 70%, 80%, 90%, 95%, or 99% by weight of diamond material or cubic boron nitride material. According to certain embodiments, the wafer of super-hard material is formed of synthetic CVD diamond which may be fabricated as large area wafers and then sliced into thin plates using the presently described cutting technique.

Figure 2:
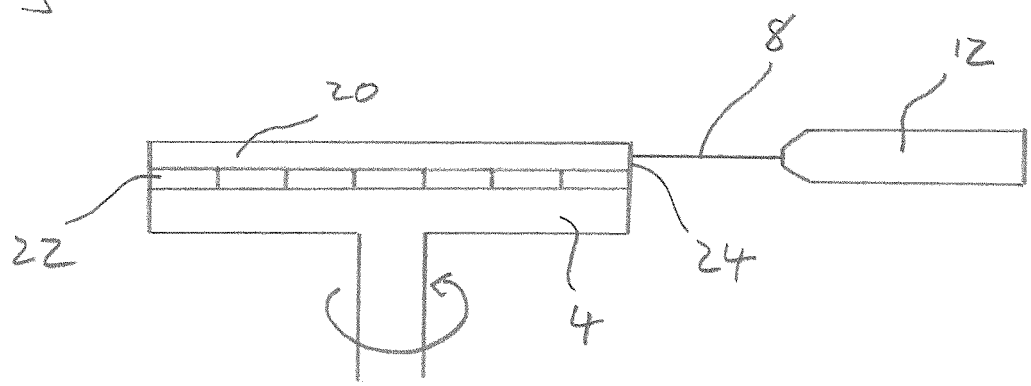
FIG. 2 shows a more specific embodiment as applied to a large area wafer of single crystal CVD diamond material grown on a tiled array of single crystal substrates.

FIG. 2 shows a more specific embodiment as applied to a large area wafer of single crystal CVD diamond material grown on a tiled array of single crystal substrates. In this example, after a single crystal CVD diamond wafer is grown on a tiled array of single crystal substrates the layered composite structure comprising the single crystal CVD diamond wafer on the tiled array of single crystal substrates is transferred to the cutting apparatus as illustrated in FIG. 2. The cutting configuration is the same as that described previously and illustrated in FIG. 1. The layered composite structure comprising the single crystal CVD diamond wafer 20 on the tiled array of single crystal substrates 22 is located on a rotatable support 4 relative to a fixed collimated cutting beam 8 with the fixed collimated cutting beam 8 being oriented perpendicular to the rotational axis 6 and positioned such that the fixed collimated cutting beam 8 is directed at an outer edge 24 of the single crystal CVD diamond wafer 20 when mounted on the support 4. The collimated cutting beam 8 is generated by a suitably adapted cutting apparatus 12. The single crystal CVD diamond wafer 20 is rotated by the support 4 and the outer edge 24 of the single crystal CVD diamond wafer 20 is cut with the fixed collimated cutting beam 8 while rotating the single crystal CVD diamond wafer 20. Cutting is maintained until a plate of single crystal CVD diamond is sliced from the single crystal CVD diamond wafer 20.

While FIGS. 1 and 2 illustrate the support and cutting apparatus in a horizontal orientation it should be noted that this is not limiting. For example, the support and cutting apparatus may be orientated in a vertical orientation such that the cutting beam is directed vertically upwards or downwards and the rotational axis of the support is disposed in a horizontal plane.

Due to the highly collimated nature of the cutting techniques described herein that are also useful for removing very thin plates of super-hard material. For example, a plate of super-hard material which is sliced from a wafer of super-hard material may have a thickness of no more than 100 µm, 80 µm, 60 µm, or 50 µm. Although it is envisaged that the collimated cutting techniques are ideally suited for slicing large area diamond wafers, they are also useful for slicing off smaller area thin plates. In this regard, edge rounding at the cut entry can be problematic. For example, when using a water-jet laser the water jet is not well contained during the initial stages of cutting. This problem may be solved by using a standard laser for the initial stages of cutting or otherwise coating another material onto the surface of the diamond through which cutting is performed such that any initial edge rounding is located in the coating rather than in the diamond material. Accordingly, in certain configurations a coating may be applied to the edge of the wafer of super-hard material prior to initiation of the cutting step or a focussed laser can be utilized to initiate the cutting prior to switching to the fixed collimated cutting beam.

A cutting apparatus can be configured to perform the cutting methodology as previously described. The cutting apparatus may comprise a rotatable support stage on which a wafer of super-hard material can be mounted and a collimated cutting beam generator oriented relative to the rotatable support stage such that the wafer of super-hard material can be sliced when mounted on the rotatable support stage and rotated.

Figure 3:
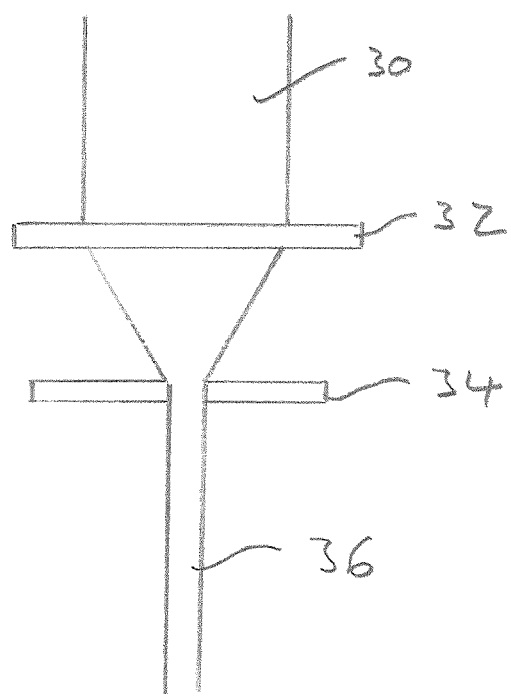
FIG. 3 shows the basic components utilized for generated a highly collimated cutting beam for use in the cutting methodology of the present invention.

FIG. 3 shows the basic components utilized for generated a highly collimated cutting beam for use in the cutting methodology described herein. A source beam 30 is focused by a focussing component 32 and then collimated using a collimator 34 to generate a narrow collimated cutting beam 36. In the laser water jet example the collimator is in the form of a water chamber and nozzle which generates a fine jet of water which acts as a waveguide for the focused laser beam. In the electron beam example, the focussing and collimating components are provided by suitably configured electric or magnetic field generating components as is known in the art.

Control of laser frequency and power for cutting super-hard materials is known in the art. Similar control considerations can be utilized when using a water jet for collimating a laser beam. However, since the water jet can also cool the region of super-hard material being cut, then it is possible to increase the laser power without causing undue cracking and failure of the super-hard material.

Having regard to the use of electron beam cutting, it has been found that the parameters of the electron beam must be carefully controlled to avoid undue cracking and failure of the super-hard material. By rotating the super-hard material such that the electron beam moves over the material at a high velocity relative to the surface of the material being cut, problems of cracking and crystal damage can be alleviated. Furthermore, a high velocity electron beam cutting method allows the use of high electron beam currents thus achieving higher cutting speeds without causing cracking and crystal damage due to excessive thermal stress and/or local fracturing at the cutting location. There is a trade-off here between cutting speed, cut depth, and cut width (determined by electron penetration depth and scattering length, a function of material density and electron energy) which can be optimized for different super-hard materials.

Advantageously, the electron beam may comprise one or more of the following characteristics:

(i) a wafer rotation speed such that the electron beam velocity over the cutting surface is in a range 100 to 5000 mms$^{-1}$, optionally no less than 200 mms$^{-1}$, 400 mms$^{-1}$, 600 mms$^{-1}$, 800 mms$^{-1}$, 1000 mms$^{-1}$, 1200 mms$^{-1}$, or 1400 mms$^{-1}$ and/or no more than 4500 mms$^{-1}$, 4000 mms$^{-1}$, 3500 mms$^{-1}$, 3000 mms$^{-1}$, 2500 mms$^{-1}$, 2000 mms$^{-1}$, 1800 mms$^{-1}$, or 1600 mms$^{-1}$.

(ii) a beam current in a range 5 mA to 120 mA; optionally no less than 10 mA, 15 mA, 20 mA, 30 mA, 40 mA, 50 mA, 60 mA, or 70 mA; optionally no more than 110 mA, 100 mA, 90 mA, 85 mA, or 80 mA; and optionally within a range defined by any combination of the aforementioned upper and lower bounds;

(iii) an accelerating voltage in a range 10 kV to 200 kV; optionally no less than 15 kV, 20 kV, 25 kV, 30 kV, or 35 kV; optionally no more than 150 kV, 125 kV, 100 kV, 90 kV, 80 kV, 70 kV, or 65 kV; and optionally within a range defined by any combination of the aforementioned upper and lower bounds;

(iv) an electron beam spot size at a point of contact on the super-hard material in a range 5 µm to 500 µm; optionally no more than 500 µm, 300 µm, 100 µm, 50 µm, or 30 µm; optionally no less than 10 µm, 15 µm, or 20 µm; and optionally within a range defined by any combination of the aforementioned upper and lower bounds;

(v) an input line energy, as defined by (accelerating voltage×beam current)/(electron beam scanning velocity), in a range 500 to 30000 Jm$^{-1}$; optionally no more than 25000 Jm$^{-1}$, 20000 Jm$^{-1}$, 15000 Jm$^{-1}$, 10000 Jm$^{-1}$, 5000 Jm$^{-1}$, or 1600 Jm$^{-1}$; optionally no less than 800 Jm$^{-1}$, 1100 Jm$^{-1}$, 1500 Jm$^{-1}$, 2000 Jm$^{-1}$, 5000 Jm$^{-1}$, or 10000 Jm$^{-1}$; and optionally within a range defined by any combination of the aforementioned upper and lower bounds;

(vi) surface energy density, as defined by (accelerating voltage×beam current)/(electron beam scanning velocity×beam width), in a range 10 to 600 MJm$^{-2}$; optionally no more than 500 MJm$^{-2}$, 400 MJm$^{-2}$, 300 MJm$^{-2}$, 200 MJm$^{-2}$, 100 MJm$^{-2}$, or 32 MJm$^{-2}$; optionally no less than 16 MJm$^{-2}$, 22 MJm$^{-2}$, 30 MJm$^{-2}$, 40 MJm$^{-2}$, 100 MJm$^{-2}$, or 200 MJm$^{-2}$; and optionally within a range defined by any combination of the aforementioned upper and lower bounds;

(vii) an energy per unit volume of material volatilized, as defined by (accelerating voltage×beam current)/(electron beam scanning velocity×½×cut width×cut depth) and/or (input line energy)/(cut cross sectional area), in a range 100 to 2500 GJm$^{-3}$; optionally no more than 2300 GJm$^{-3}$, 2000 GJm$^{-3}$, 1700 GJm$^{-3}$, 1400 GJm$^{-3}$, 1100 GJm$^{-3}$, 800 GJm$^{-3}$, or 600 GJm$^{-3}$; optionally no less than 150 GJm$^{-3}$, 200 GJm$^{-3}$, 250 GJm$^{-3}$, 300 GJm$^{-3}$, 350 GJm$^{-3}$, 400 GJm$^{-3}$, 450 GJm$^{-3}$, or 500 GJm$^{-3}$; optionally within a range defined by any combination of the aforementioned upper and lower bounds.

The optimal value for each beam parameter will depend to some extent on the values of the other beam parameters selected and the exact nature of the super-hard material being cut. However, in general the aforementioned electron beam parameters have been found to achieve good quality cutting of super-hard materials at a high cutting rate without substantial cracking and crystal damage.

While this invention has been particularly shown and described with reference to embodiments, it will be understood to those skilled in the art that various changes in form and detail may be made without departing from the scope of the invention as defined by the appending claims.

The invention claimed is:

1. A method of fabricating a plate of synthetic CVD diamond, the method comprising:
   providing a substrate have a lateral dimension of at least 40 mm;
   growing a layer of synthetic CVD diamond material on the substrate using a chemical vapour deposition process; and
   slicing one or more plates of synthetic CVD diamond material from the substrate using a collimated cutting beam, the or each plate of synthetic CVD diamond material having a lateral dimension of at least 40 mm, wherein the collimated cutting beam is collimated with a half angle divergence of no more than 5 degrees.

2. The method according to claim 1, wherein the synthetic CVD diamond is single crystal CVD diamond.

3. The method according to claim 2, wherein the substrate comprises a tiled array of single crystal diamond substrates, wherein the growing comprises growing single crystal CVD diamond on the tiled array of single crystal diamond substrates, and wherein the slicing comprises slicing a plate of the single crystal CVD diamond from the tiled array of single crystal diamond substrates.

4. The method according to claim 1, wherein the layer of synthetic CVD diamond material is grown to a thickness of at least 100 µm.

5. The method according to claim 1, wherein a plurality of plates are sliced from the layer of synthetic CVD diamond material.

6. The method according to claim 1, wherein the or each plate of synthetic CVD diamond material which is sliced from the layer of super-hard material has a thickness of no more than 100 µm.

7. The method according to claim 1, wherein the or each plate of synthetic CVD diamond material has a lateral dimension of at least 50 mm.

8. The method according to claim 1, wherein the collimated cutting beam is collimated with a half angle divergence of no more than 3 degrees.

9. The method according to claim 1, wherein the slicing comprises cutting through the layer of synthetic CVD diamond material in at least two different directions to remove the or each plate of synthetic CVD diamond material from the substrate.

10. The method according to claim 1, wherein the collimated cutting beam is in the form of an electron beam.

11. The method according to claim 1, wherein the collimated cutting beam is in the form of a water-jet laser, and wherein the water-jet laser and the layer of super-hard material are configured such that during slicing water is ejected from a cut formed in the synthetic CVD diamond material thereby reducing pooling of water at a base of the cut.

12. The method according to claim 11, wherein water is ejected from the cut formed in the synthetic CVD diamond material thereby reducing pooling of water at the base of the cut by rotating the layer of synthetic CVD diamond material relative to the collimated cutting beam to force water from the cut.

* * * * *